United States Patent
Saiki et al.

(10) Patent No.: US 7,202,156 B2
(45) Date of Patent: Apr. 10, 2007

(54) PROCESS FOR MANUFACTURING A WIRING SUBSTRATE

(75) Inventors: Hajime Saiki, Nagoya (JP); Atsuhiko Sugimoto, Nagoya (JP); Mikiya Sakurai, Nagoya (JP)

(73) Assignee: NGK Spark Plug Co., Ltd., Nagoya-shi, Aichi (JP)

( * ) Notice: Subject to any disclaimer, the term of this patent is extended or adjusted under 35 U.S.C. 154(b) by 302 days.

(21) Appl. No.: 10/989,515

(22) Filed: Nov. 17, 2004

(65) Prior Publication Data

US 2005/0106854 A1    May 19, 2005

(30) Foreign Application Priority Data

Nov. 18, 2003   (JP)   ............... P2003-388487

(51) Int. Cl.
*H01L 21/4763* (2006.01)

(52) U.S. Cl. ............ 438/622; 438/670; 438/677; 438/678; 438/687

(58) Field of Classification Search ........ 438/622–624, 438/669–670, 677–678, 687; 29/829; 174/250
See application file for complete search history.

(56) References Cited

U.S. PATENT DOCUMENTS 6,693,029 B2 *  2/2004  Iijima et al. ............... 438/622
6,759,318 B1 *  7/2004  Chang ...................... 438/612
6,855,626 B2 *  2/2005  Sato et al. ................. 438/622

FOREIGN PATENT DOCUMENTS

JP    2003-133725    5/2003

\* cited by examiner

*Primary Examiner*—Thanhha S. Pham
(74) *Attorney, Agent, or Firm*—Stites & Harbison PLLC; Ross F. Hunt, Jr.

(57) ABSTRACT

A process for manufacturing a wiring substrate, comprising: a step of forming an insulating resin layer containing an inorganic filler over a wiring layer formed on at least one surface of an insulating substrate; a step of forming a thin copper film layer by roughening a surface of the insulating resin layer and plating the same electrolessly with copper; a step of forming an insulating film over the thin copper film layer; a step of forming plated resists profiling a pattern by exposing and developing the insulating film with the pattern; and a step of forming wiring pattern layers by an electrolytic copper plating on a surface of the insulating resin layer having the plated resists formed thereon, wherein at least one of the plated resists has a width of less than 20 μm, and the plated resists include adjoining plated resists in which a clearance between said adjoining plated resists has a width of less than 20 μm.

6 Claims, 4 Drawing Sheets

PROCESS FOR MANUFACTURING A WIRING SUBSTRATE

FIELD OF THE INVENTION

The present invention relates to a wiring substrate manufacturing process capable of forming a wiring pattern layer (or a built-up wiring layer) easily at a fine pitch.

BACKGROUND OF THE INVENTION

According to the trend of recent years for a high performance and a high signal-processing rate, there has been enhanced a demand for making the size of the wiring substrate smaller and the pitch of the wiring pattern layers (or the built-up wiring layer) finer.

For example, one wiring pattern layer is generally restricted by a practical limit of the section of a length×a width of 25 μm×20 μm (as referred to JP-A-2003-133725 (page 6), for example). However, it has been demanded that the section is made to have a length and a width of 20 μm or less×20 μm or less.

In order to satisfy the demand, it is necessary to enhance the shaping and sizing precisions of a plated resist for forming the wiring-pattern layer.

Another problem is that the plated resists are liable to be deformed by the penetration of a plating liquid when they are electrolytically plated with copper to form the wiring pattern layers.

Heretofore, however, there has been any disclosure on the technique, by which the plated resists can be reliably formed to achieve the wiring pattern layers of the aforementioned fine pitch.

SUMMARY OF THE INVENTION

The invention contemplates to solve the aforementioned problems in the background art, and has an object to provide a wiring substrate manufacturing process which can form a plated resist for forming wiring pattern layers (or built-up wiring layers) at a fine pitch and excellent in shaping and sizing precisions.

The invention has been found out by investigating an insulating film for forming a wiring pattern layer by a semi-additive method and for forming a plated resist, and a method of boring the insulating film.

Specifically, according to the invention, there is provided a process for manufacturing a wiring substrate comprising: the step of forming an insulating resin layer containing an inorganic filler over a wiring layer formed on at least one of the surface and the back of an insulating substrate; the step of forming a thin copper film layer by roughening the surface of said insulating resin layer and plating the same electrolessly with copper; the step of forming an insulating film over said thin copper film layer; the step of forming plated resists profiling a predetermined pattern by exposing and developing said insulating film with said predetermined pattern; and the step of forming wiring pattern layers by an electrolytic copper plating on the surface of said insulating resin layer having said plated resists formed thereon. At least one of said plated resists (preferably, each of said plated resists) has a width less than 20 μm (but excepting 0 μm), and wherein said plated resists include two adjoining plated-resists in which a clearance between said two adjoining plated resists has a width of less than 20 μm (but excepting 0 μm) (preferably, each of said plated resists has a clearance of a width of less than 20 μm (but excepting 0 μm) between it and its adjoining plated resist).

According to this process, the width of one plated resist formed by the semi-additive method and the width of the clearance between the two adjoining plated resists can be precisely formed to the small size less than 20 μm. This makes it possible to form the narrow wiring pattern layer of the width less than 20 μm reliably in the clearance between the plated resists, and to wire the two adjoining wiring pattern layers at the fine pitch less than 20 μm. It is, therefore, possible to provide the wiring substrate satisfying the demands for the size reduction of the wiring substrate and for the fine pitch of the wiring pattern layer.

Here, the insulating substrate includes not only the core substrate made of a resin or ceramics but also the insulating resin layer in the built-up insulating layer or the coreless substrate.

There can also be provided, as a preferable embodiment, a wiring substrate manufacturing process, wherein the inorganic filler has an average grain size of 1.0 μm or more and 10.0 μm or less and composes 30 to 50 wt. % (% by weight) of the insulating layer. According to this process, the volume and weight of the inorganic filler in the insulating resin layer are more than those of the prior art so that the surface can be roughened and so that the thin copper film layer to be formed in the traces can be formed flat and strong. As a result, it is possible to form the narrow plated resist can be formed in a precise size on the thin copper film layer.

Here, the inorganic filler includes $SiO_2$ having a generally spherical shape or a shape of elliptical sectional, for example.

There can be further provided, as a preferable embodiment, a wiring substrate manufacturing process, wherein the insulating resin layer has a thermal expansion coefficient in a planar (X-Y) direction: about 50 ppm/° C. or less (but excepting 0). According to this process, the inorganic filler is contained in a large quantity, and the thermal expansion coefficient is made lower than that of the prior art so that it can be approximated to that of electronic parts such as an IC chip to be mounted on s solder resist layer over the surface of the insulating resin layer. Therefore, it is possible to mount the electronic parts reliably.

There can be further provided, as a preferable embodiment, a wiring substrate manufacturing process, wherein the exposure is caused by an ultraviolet ray having an exposure of 60 $mJ/cm^2$ or more.

According to this process, the exposure is increased from that of the prior art by about 10 $mJ/cm^2$ so that the plated resist of the predetermined pattern profiling the exposure pattern can be formed on the insulating film.

There can be further provided, as a preferable embodiment, a wiring substrate manufacturing process, wherein the inorganic filler is composed mainly of an epoxy resin, for example, and has properties of an elongation: 6% or less, a Young's modulus: 3.6 to 5 GPa, and a thermal expansion coefficient in the planar (X-Y) direction: about 50 ppm/° C. According to this process, the plated resist of the predetermined pattern by the aforementioned exposure and development can be formed at the fine pitch by the aforementioned material and properties of the insulating film.

There can be further provided, as a preferable embodiment, a wiring substrate manufacturing process, wherein at least one of the plated resists (more preferably, each of the plated resists) has a thickness of 20 to 30 μm, and the plated resists include adjoining plated resists in which the clearance between said adjoining plated resists has a depth of 20 to 30 μm. (preferably, each of the plated resists has the clearance of a depth of 20 to 30 μm between it and its adjoining plated resist). According to this process, it is possible to form the plated resist having a width of 20 μm or less and a thickness of 20 to 30 μm and the clearance positioned between the two plated resists and having the section of a similar sectional size. Therefore, it is possible to manufacture the wiring pattern layer of the fine pitch and the wiring substrate including the former.

DETAILED DESCRIPTION OF THE INVENTION

The best mode for carrying out the invention will be described in the following.

FIGS. 1 to 7 schematically show one mode of a process for manufacturing a wiring substrate according to the invention.

Figure 1:
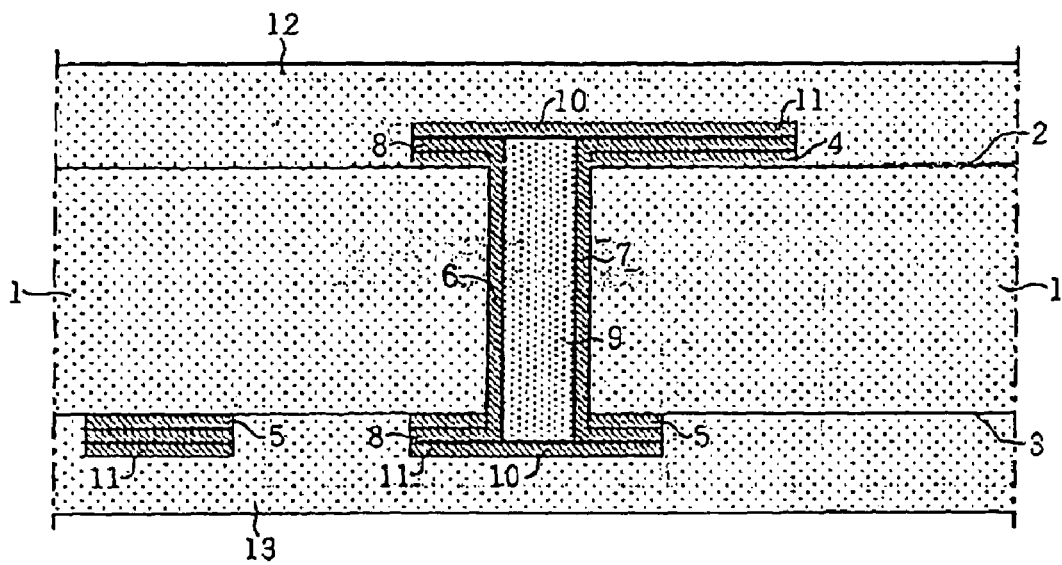
FIG. 1 is a schematic section showing one step of a process for manufacturing a wiring substrate according to the invention.

On the surface 2 and the back 3 of a core substrate (or an insulating substrate) 1 made of a bismaleimide triazine (BT) resin having a thickness of about 0.8 mm, as shown in FIG. 1, there are individually formed wiring layers 11 and 11 including copper foils 4 and 5 and copper-plated films 8.

The copper foils 4 and 5, the copper-plated films 8 and the wiring layers 11 and 11 are formed by patterning the copper foils or copper-plated layers formed on the whole faces of the surface 2 and the back 3 of the core substrate 1 in advance by the well-known subtractive method).

On the inner wall of a through hole 6 extending between the surface 2 and the back 3 of the core substrate 1, as shown in FIG. 1, there is positioned a through-hole conductor 7 which is formed simultaneously with the copper-plated films 8 into a generally cylindrical shape having a thickness of about 60 μm. The through-hole conductor 7 is filled therein with a filler resin 9. The wiring layers 11 and 11 are formed by patterning the copper-plated layer, which is formed to include a plated cover 10 covering the two end faces (i.e., the upper/lower ends of FIG. 1) of the filler resin 9, together with the copper foils 4 and 5 and the copper-plated films 8. Here the filler resin 9 may be either a conductive resin containing metal powder or an inconductive resin.

First of all, over the wiring layers 11 and 11 formed on the surface 2 and the back 3 of the core substrate 1, as shown in FIG. 1, there are individually formed insulating resin layers 12 and 13 which contain an inorganic filler and have a thickness of about 40 μm. The inorganic filler is generally spherical $SiO_2$ having an average grain diameter of 1 to 10 μm, and makes 30 to 50 wt. % of the insulating resin layers 12 and 13.

Here, the insulating resin layers 12 and 13 have a thermal expansion coefficient of 50 ppm/° C. or less (e.g., 46 ppm/° C. in this embodiment) in a planar (X-Y) direction, and can also be formed not only by a method of applying a liquid epoxy resin with a roll coater but also by a method of thermocompression-bonding an epoxy resin film.

Next, the insulating resin layers 12 and 13 are irradiated at predetermined positions with the not-shown carbon-dioxide gas laser. As a result, in the insulating resin layers 12 and 13, as shown in FIG. 2, there are formed generally conical via holes 14 and 15 which extend through the resin layers 12 and 13 so that the wiring layers 11 are exposed to the bottom faces thereof.

Moreover, the inner walls of the via holes 14 and 15, the wiring layers 11 exposed to the bottom faces of those holes, and the surfaces of the insulating resin layers 12 and 13 are subjected in advance to a roughening treatment with $KMnO_4$ or the like, and are electrolessly plated with copper after a plating catalyst containing Pd or the like was applied thereto.

Figure 2:
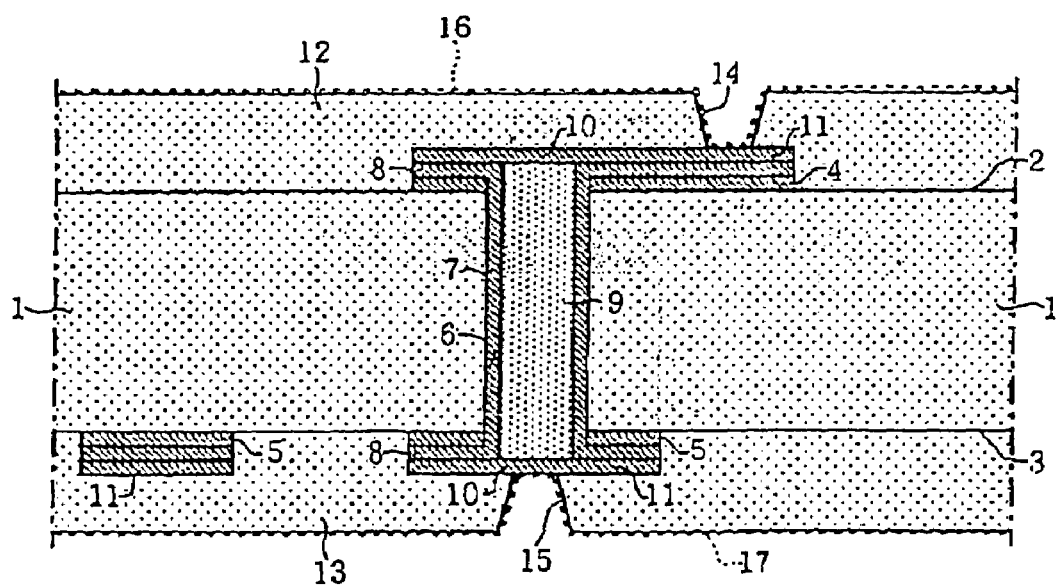
FIG. 2 is a schematic section showing a manufacturing process subsequent to FIG. 1.

As a result, thin copper film layers 16 and 17 having a thickness of about 0.5 μm are formed, as indicated by broke lines in FIG. 2, on the via holes 14 and 15, on the wiring layers 11 exposed to the bottom faces of the via holes, and on the surfaces of the insulating resin layers 12 and 13.

Figure 3:
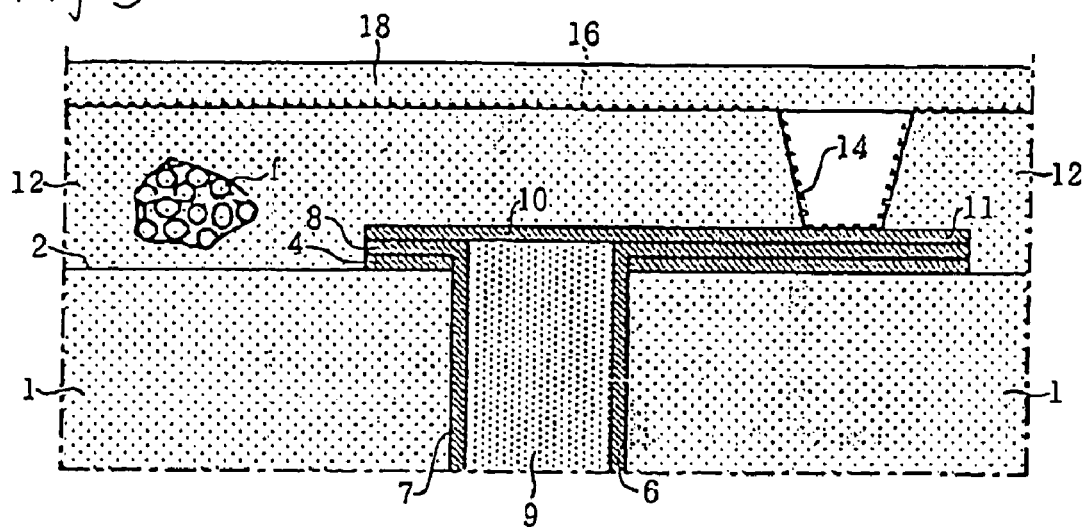
FIG. 3 is a schematic section showing a manufacturing process subsequent to FIG. 2.

Next, an insulating film 18 having a thickness of 25 μm is formed on the thin copper film layer 16 (17), as exemplified in FIG. 3. The insulating film 18 is composed mainly of an epoxy resin, for example, and have properties of an elongation: 6% or less, a Young's modulus: 3.6 to 5 GPa, and a thermal expansion coefficient in a planar (X-Y) direction: about 50 ppm/° C. or less.

Letter f in FIG. 3 designates a $SiO_2$ filler (or an inorganic filler) contained in the insulating resin layer 12 (13).

Moreover, the insulating film 18 is exposed to the not-shown predetermined pattern and is developed (or etched). This exposing light is an ultraviolet ray, and its exposure is set to 60 mJ/cm² or more.

Figure 4:
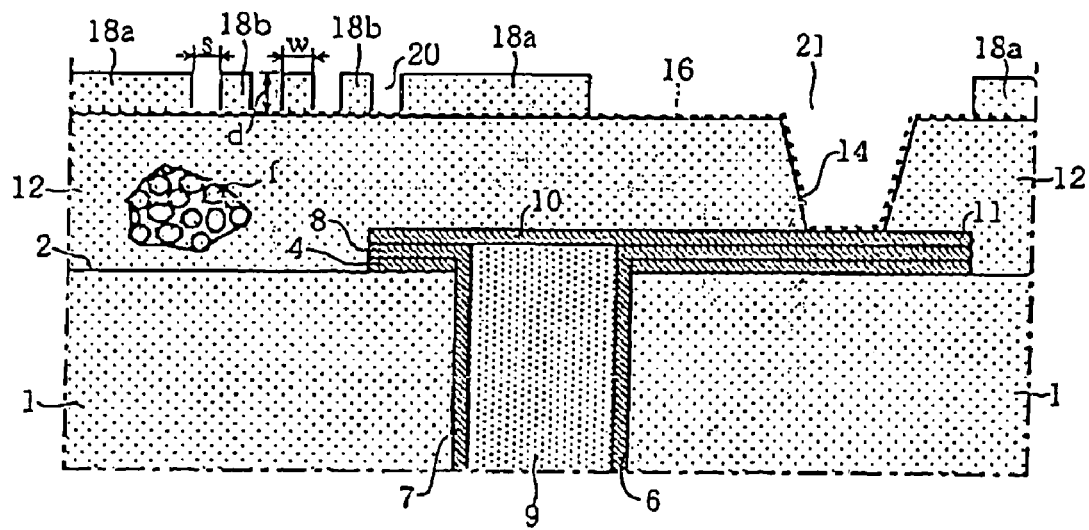
FIG. 4 is a schematic section showing a manufacturing process subsequent to FIG. 3.

As a result, the insulating film 18 is formed into a wider plated resist 18a and a narrower plated resist 18b profiling the aforementioned predetermined pattern, as shown in FIG. 4.

As shown in FIG. 4, a wider clearance 21 to communicate with the lower via hole 14 is formed between the wider plated resists 18a and 18a, and a narrower clearance having a sectional size like that of the narrower plated resists 18b is positioned between the plated resists 18a and 18a and between the plated resists 18b and 18b.

The narrow plated resists 18b have a width w less than 20 μm (e.g., 15 μm), and the narrower clearance 20 also has a width s less than 20 μm (e.g., 15 μm). In other words, the plated resist 18b has a rectangular section of a width: 15 μm×a thickness: 25 μm, and is firmly formed on the thin copper film layer 16 (17) while keeping that shape. The clearance 20 also has a rectangular section of a width: 15 μm×a depth d: 25 μm.

Next, the thin copper film layer 16 (17), which is positioned on the surface of the insulating resin layer 12 (13) having the plated resists 18a and 18b formed thereon, is electrolytically plated with copper.

Figure 5:
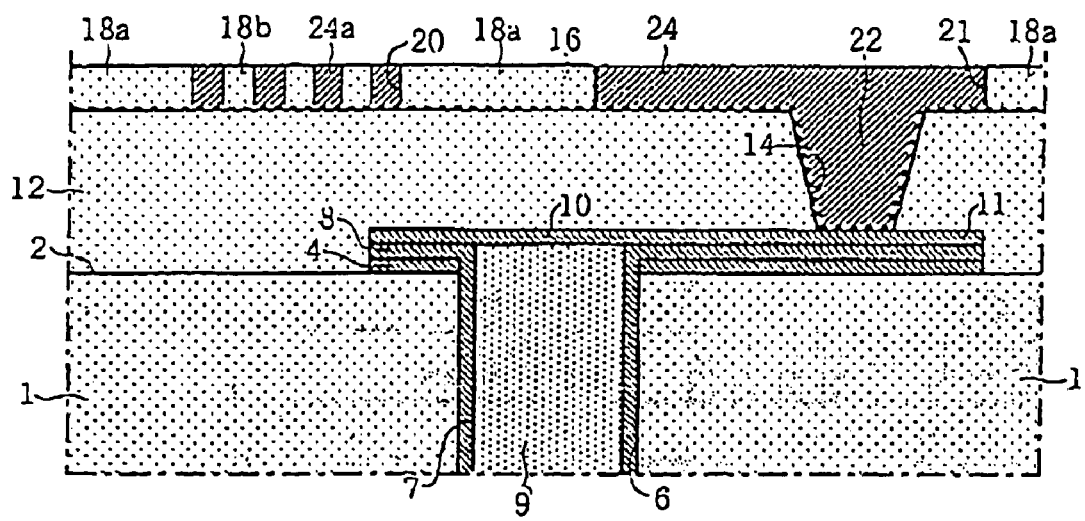
FIG. 5 is a schematic section showing a manufacturing process subsequent to FIG. 4.

As a result, a wider wiring pattern layer 24 is formed between the wider plated resists 18a and 18b, and narrower wiring pattern layers 24a are individually formed between the plated resists 18a and 18a and between the plural narrower plated resists 18b and 18b, as shown in FIG. 5. These wiring pattern layers 24a have a rectangular section of a width: 15 μm×a thickness: 25 μm. Here, the wiring pattern layer 24 is additionally subjected to an electrolytic copper plating to form such a filled via conductor 22 (23) in the via hole 14 (15) as connects with the lower wiring layer 11.

Next, the plated resists 18a and 18b and the thin copper film layer 16 (17) positioned just below are removed by making them contact with the well-known peeling liquid.

Figure 6:
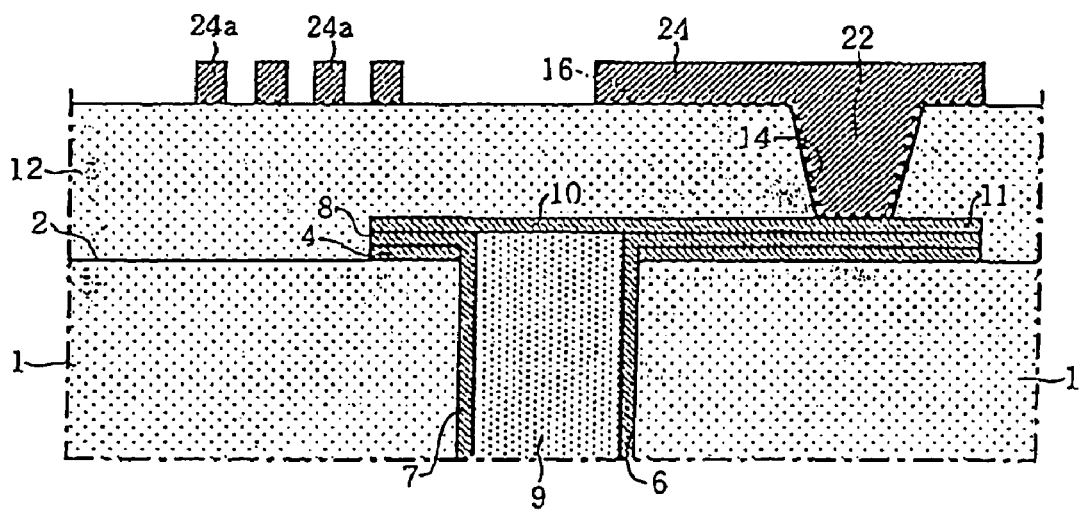
FIG. 6 is a schematic section showing a manufacturing process subsequent to FIG. 5.

As a result, the wider wiring pattern layer 24 and the plural narrower wiring layer (or wiring pattern layer) 24a are formed at a fine pitch on the surface of the insulating resin layer 12 (13), as shown in FIG. 6.

Figure 7:
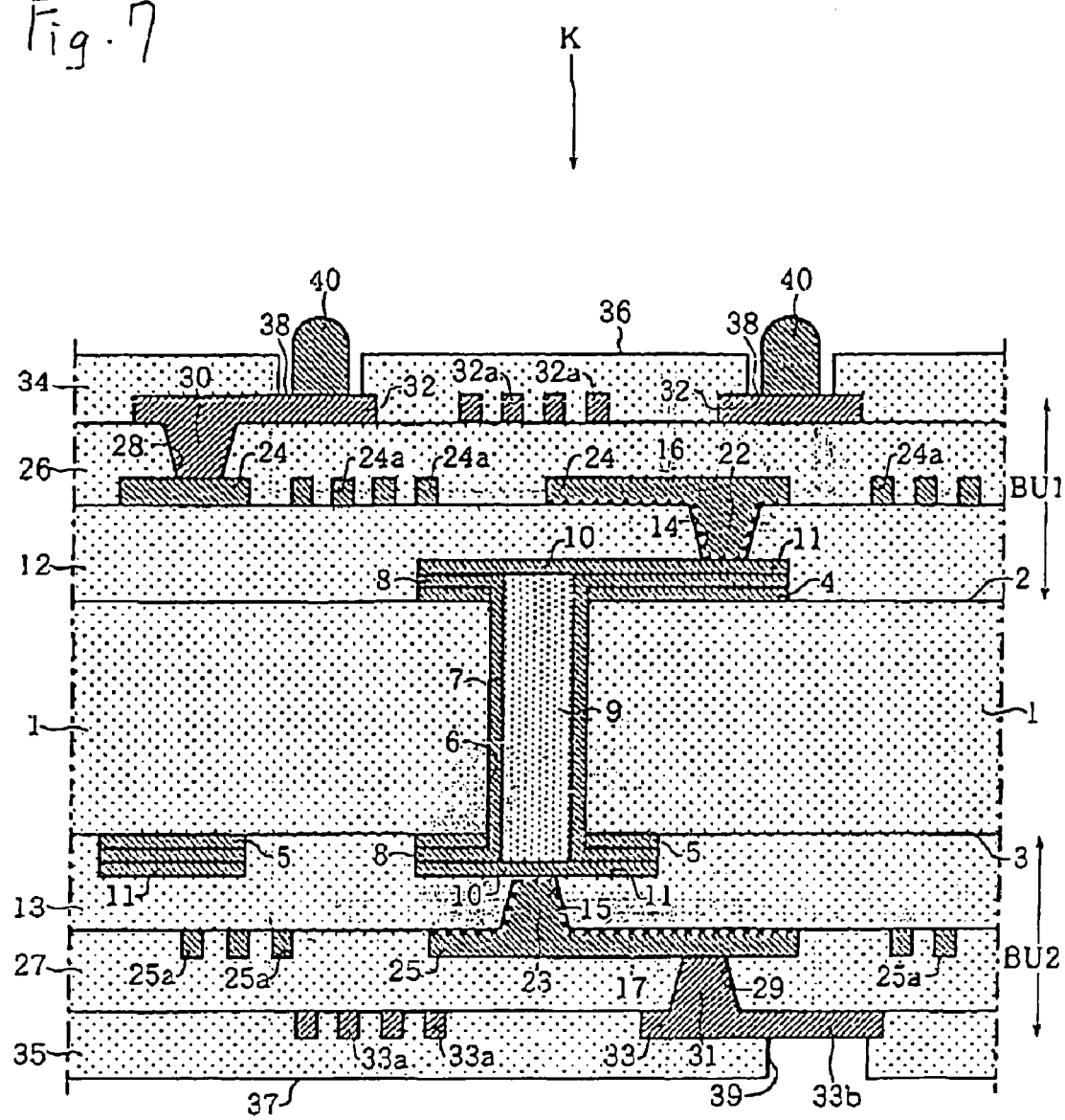
FIG. 7 is a schematic section showing a manufacturing process subsequent to FIG. 6, and a wiring substrate obtained.

As shown in FIG. 7, moreover, wider wiring pattern layer 25 and a plurality of narrower wiring line (or wiring pattern layers) 25a like the aforementioned ones are also formed at the fine pitch on the surface of the insulating resin layer 13 on the side of the back 3 of the core substrate 1.

As shown in FIG. 7, moreover, an insulating resin layer 26 like before is formed on the surface of the insulating resin layer 12 having the aforementioned wiring pattern layers 24 and 24a formed there over. An insulating resin layer 27 like before is formed on the surface of the insulating resin layer 13 having the aforementioned wiring pattern layers 25 and 25a formed thereover. The insulating resin layers 26 and 27 are roughened on their surfaces, and via holes are then formed like before at predetermined positions.

Next, thin copper film layers like before are individually formed on the surfaces of the insulating resin layers 26 and 27 and in the via holes 28 and 29, and insulating films like before are individually formed thereover, as shown in FIG. 7. These insulating films are subjected to an exposure and a development-like before to form plated resists of a predetermined pattern, and the thin copper film layers positioned between those plated resists are electrolytically plated with copper like before.

As a result, wider wiring pattern layers 32 and 33 and a plurality of narrower wiring layers (or wiring pattern layers), which are positioned at a fine pitch like before, are formed on the surfaces of the insulating resin layers 26 and 27, as shown in FIG. 7.

Simultaneously with this, filled via conductors 30 and 31 are formed in the via holes 28 and 29 to connect the wiring pattern layers 24 and 32 and the wiring pattern layers 30 and 31. As a result, built-up layers BU1 and BU2 are formed over the surface 2 and the back 3 of the core substrate 1, as shown in FIG. 17.

As shown in FIG. 7, moreover, a solder resist layer (or an insulating layer) 34 made of a resin like before and having a thickness of about 25 μm is formed over the surface of the insulating resin layer 26 having the wiring pattern layers 32 and 32a formed thereon. A solder resist layer (or an insulating layer) 35 like before is formed over the surface of the insulating resin layer 27 having the aforementioned wiring pattern layers 35 and 35a formed thereon.

The solder resist layers 34 and 35 are bored so deep at predetermined positions by a laser machining as to reach the wiring pattern layers 32 and 33, thereby to form a land 36 to be opened to a first principal face 36 and an opening 39 to be opened to a second principal face 37, as shown in FIG. 7.

A solder bump 40 protruding higher than the first principal face 36 is formed on the land 38, so that electronic parts such as the not-shown IC chip can be mounted thereover through solder. Here, the solder bump 40 is made of an alloy of a low melting point such as Sn—Cu, Sn—Ag or Sn—Zn.

As shown in FIG. 7, moreover, the surface of a wiring line 33b, which extends from the wiring pattern layer 33 and which is positioned on the bottom face of the opening 39, is plated, although not shown, with Ni or Au to provide connection terminals to be connected with a printed substrate such as the not-shown mother board.

Through the individual steps thus far described, it is possible to provide a wiring substrate K, which comprises the built-up layer BU1 and the built-up layer BU1 over the surface 2 and the back 3 of the core substrate 1, as shown in FIG. 7. The built-up layer BU1 includes the wiring pattern layers 24, 24a, 32 and 32a wired at the fine pitch, and the built-up layer BU2 includes the wiring pattern layers 25, 25a, 33 and 33a.

Here, the wiring substrate K may also be formed to have the built-up layer BU1 exclusively over the surface 2 of the core substrate 1. In this mode, only the wiring layer 11 and the solder resist layer 35 are formed on the side of the back 3.

According to the process for manufacturing the wiring substrate K of the invention thus far described, the width of the narrower plated resist 18b formed by the semi-additive method and the width of the clearance 20 between the adjoining plated resists 18b and 18b are made finely with a size less than 20 μm. As a result, it is possible to form the narrower wiring pattern layer 24a and so on having the width of 20 μm reliably in the aforementioned clearances 20, and to wire the adjoining wiring pattern layers 24a and 24a and so on at the fine pitch of 20 μm or less. Moreover, the insulating resin layers 12, 13, 26 and 27 and soon have low thermal expansion coefficients in the planar direction so that the IC chip can be highly reliably mounted on the first principal face 36.

The invention should not be limited to the mode of embodiment thus far described.

The individual steps of the aforementioned manufacturing process may also be performed by a large-sized multi-panel having a plurality of core substrates 1 or core units.

Moreover, the material for the core substrate should not be limited to the aforementioned BT resin but may be exemplified by an epoxy resin or a polyimide resin. Alternatively, it is also possible to use a composite material which is prepared by containing glass fibers in a fluorine resin having a three-dimensional net structure such as PTFE having continuous pores.

Alternatively, the material of the aforementioned core substrate may be ceramics. This ceramics may be alumina, silicic acid, glass ceramics or aluminum nitride, and may also be exemplified by a low-temperature sintered substrate which can be sintered at a relatively low temperature such as about 1,000° C. Moreover, a metal core substrate made of a copper alloy or a Ni alloy containing 42 wt. % of Fe may be used and is covered all over its surface with an insulating material.

Moreover, the mode may also be modified into a coreless substrate having no core substrate. In this modification, for example, the aforementioned insulating resin layers 12 and 13 act as the insulating substrate of the invention.

Moreover, the material for the aforementioned wiring layer 11 may be not only the aforementioned Cu (copper) but also Ag, Ni or Ni—Au. Alternatively, the wiring layer 10 does not use the metal-plated layer but may also be formed by a method of applying a conductive resin.

Moreover, the aforementioned insulating resin layers 12 and 13 and so on may also be exemplified, if it contains the aforementioned inorganic filler, not only by the aforementioned resin composed mainly of an epoxy resin or but also by a polyimide resin, a BT resin or a PPE resin, which has similar heat resistance and pattern forming properties, or a resin-resin composite material which is prepared by impregnating a fluorine resin having a three-dimensional net structure such as PTFE having continuous pores with a resin such as an epoxy resin.

Moreover, the via conductors need not be the aforementioned filled via conductor 22 but can be an inverted conical conformable via conductor which is not filled therein completely with a conductor. Alternatively, the via conductors may take a staggered shape, in which they are stacked while being axially shifted, or a shape, in which a wiring layer extending midway in the planar direction is interposed.

This application is based on Japanese Patent application JP 2003-388487, filed Nov. 18, 2003, the entire content of which is hereby incorporated by reference, the same as if set forth at length.

What is claimed is:

1. A process for manufacturing a wiring substrate, comprising:
   a step of forming an insulating resin layer containing an inorganic filler over a wiring layer formed on at least one surface of an insulating substrate;
   a step of forming a thin copper film layer by roughening a surface of the insulating resin layer and plating the same electrolessly with copper;
   a step of forming an insulating film over the thin copper film layer;
   a step of forming plated resists profiling a pattern by exposing and developing the insulating film with the pattern; and
   a step of forming wiring pattern layers by an electrolytic copper plating on a surface of the insulating resin layer having the plated resists formed thereon,
   wherein at least one of the plated resists has a width of less than 20 μm, and the plated resists include adjoining two plated resists in which a clearance between the two adjoining plated resists has a width of less than 20 μm.

2. The process according to claim 1, wherein each of the plated resists has a width of less than 20 μm.

3. The process according to claim 1, wherein each of the plated resists has a clearance of a width of less than 20 μm between it and its adjoining plated resist.

4. The process according to claim 1, wherein the inorganic filler has an average grain size of 1.0 to 10.0 μm, and an amount of the inorganic filler is 30 to 50% by weight of the insulating resin layer.

5. The process according to claim 1, wherein the insulating resin layer has a thermal expansion coefficient in a planar direction of more than 0 ppm/° C. and no more than 50 ppm/° C.

6. The process according to claim 1, wherein the exposing is conducted by an ultraviolet ray having an exposure of 60 mJ/cm$^2$ or more.

* * * * *